(12) United States Patent
Chen-Hua

(10) Patent No.: US 6,191,462 B1
(45) Date of Patent: *Feb. 20, 2001

(54) NITRIDE-OXIDE SIDEWALL SPACER FOR SALICIDE FORMATION

(75) Inventor: Yu Chen-Hua, Hsin-Chu (TW)

(73) Assignee: Taiwan Semiconductor Manufacturing Company, Hsin-Chu (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/026,815

(22) Filed: Feb. 20, 1998

Related U.S. Application Data

(62) Division of application No. 08/719,233, filed on Sep. 24, 1996, now Pat. No. 5,747,373.

(51) Int. Cl.$^7$ .................... H01L 29/76; H01L 27/088
(52) U.S. Cl. .................... 257/408; 257/344; 257/412; 257/413; 257/900
(58) Field of Search .................... 257/412, 408, 257/344, 336, 337, 388, 900, 413; 438/231, 232, 305, 306

(56) References Cited

U.S. PATENT DOCUMENTS

| | | | |
|---|---|---|---|
| 4,949,136 | * 8/1990 | Jain et al. | 257/344 |
| 5,162,884 | * 11/1992 | Liou et al. | 257/384 |
| 5,288,666 | * 2/1994 | Lee | 438/299 |
| 5,411,906 | 5/1995 | Johnson et al. | 257/344 |
| 5,498,555 | 3/1996 | Lin | 257/344 |
| 5,518,940 | 5/1996 | Hodate et al. | 438/151 |
| 5,518,945 | 5/1996 | Bracchitta et al. | 438/307 |
| 5,719,425 | * 2/1998 | Akram et al. | 257/408 |
| 5,759,901 | * 6/1998 | Loh et al. | 438/305 |

FOREIGN PATENT DOCUMENTS

407115188 * 5/1995 (JP).

* cited by examiner

*Primary Examiner*—Steven Loke
*Assistant Examiner*—Hung Kim Vu
(74) *Attorney, Agent, or Firm*—George O. Saile; Stephen B. Ackerman

(57) ABSTRACT

A method of fabricating a MOSFET device structure, featuring a double insulator spacer, and improved source and drain engineering, has been developed. A silicon nitride-silicon oxide, double spacer, is used to prevent thinning of the insulator spacer, during a buffered hydrofluoric acid procedure, used prior to a metal deposition and metal silicide formation. A lightly doped source and drain region is formed prior to creation of the silicon oxide spacer, a medium doped source and drain region is formed prior to creation of the silicon nitride spacer, and a heavily doped source and drain region is formed following the creation of the silicon nitride spacer. This source and drain configuration increases device performance and reliability.

5 Claims, 2 Drawing Sheets

NITRIDE-OXIDE SIDEWALL SPACER FOR SALICIDE FORMATION

This is a division of patent application Ser. No. 08/719,233, filing date Sep. 24, 1996, now U.S. Pat. No. 5,747,373. A Nitride-Oxide Sidewall Spacer For Salicide Formation, assigned to the same assignee as the present invention.

BACKGROUND OF THE INVENTION (1) Field of the Invention

The present invention relates to a method of fabricating a metal oxide semiconductor field effect transistor, (MOSFET), device, and more specifically to a method of reducing gate to substrate shorting during the metal silicide formation processes.

(2) Description of Prior Art

The semiconductor industry is continually striving to improve the performance of MOSFET devices. The ability to create devices with sub-micron features has allowed significant decreases, in performance degrading parasitic capacitances, and resistances, to be achieved, thus resulting in performance benefits. The attainment of sub-micron features has been accomplished via advances in several semiconductor fabrication disciplines. For example in photolithograhy the development of more sophisticated exposure cameras, as well as the use of more sensitive photoresist materials have allowed sub-micron features, in photoresist layers, to be routinely achieved. In addition the development of more advanced dry etching tools and processes have allowed the submicron images in photoresist layers to be successfully transferred to underlying materials used in MOSFET structures. In addition to contributions supplied by advances in MOSFET processing disciplines, performance improvements have also been realized via the use of more conductive materials. For example the use of polycide gate structures, a gate structure comprised of a metal silicide layer overlying a polysilicon layer, has significantly reduced the resistance of the gate structure, when compared to the previously used polysilicon gate structures. Polycide gate formation, when performed using a salicide process, (Self-ALigned-silICIDE), also results in the conductive metal silicide overlying source and drain regions, resulting in performance benefits.

The ability to achieve successful salicide formation dependent on the integrity of the insulator spacers, on the sides of the polysilicon gate structure, during the salicide formation procedure. For example prior to metal deposition, native oxide on the exposed top surface of the polysilicon gate structure, as well as the top surface of the source and drain region, has to be removed, to allow the subsequent metal silicide formation to be successful. Native oxide will prevent the reaction between the metal and the exposed silicon surfaces during an anneal cycle. Therefore a buffered hydrofluoric acid procedure is used prior to metal deposition. However if the insulator spacer, on the sides of the polysilicon gate structure, becomes defective, or significantly thinned, exposing polysilicon, as a result of the buffered hydrofluoric acid, metal pre-clean procedure, unwanted metal silicide formation, or metal silicide bridging, can occur on the sides of the polysilicon gate structure, resulting in gate to substrate shorting or leakages.

This invention will describe a process in which a double insulator spacer is used to prevent the metal silicide bridging phenomena, as well as allowing additional resistance decreases to be achieved via source and drain engineering procedures. After formation of a lightly doped source and drain region, a first, silicon oxide spacer is formed on the sides of the polysilicon gate, followed by the creation of a medium doped source and drain region. A second insulator spacer, silicon nitride, is then created, followed by the formation of a heavily doped source and drain region. A significant metal pre-clean procedure, using buffered hydrofluoric acid, can now be performed, without risking the integrity of the silicon nitride-silicon oxide spacer insulator, increasing the prospects of a successful salicide procedure. Prior art, such as Bracchita, et al, in U.S. Pat. No. 5,518,945, describe an insulator spacer, comprised of two materials, a silicon nitride-doped oxide composite. However that prior art does not teach the concept of creating two insulator spacers, allowing an additional source and drain procedure, to be performed between insulator spacer procedures.

SUMMARY OF THE INVENTION

It is an object of this invention to fabricate a MOSFET device using a salicide process.

It is another object of this invention to use a double insulator spacer structure, to prevent thinning of the insulator spacer during the metal pre-clean procedure, and thus prevent gate to substrate, metal silicide bridging from occurring during the salicide formation procedure.

It is yet another object of this invention to decrease MOSFET device resistance by forming a medium doped source and drain region, after formation of the first insulator spacer, but before the formation of the second insulator spacer.

In accordance with the present invention a method of creating a MOSFET device, with a polycide gate, a double insulator spacer, and a three stage source and drain region, is described. After formation of field oxide regions, a gate insulator layer is grown. A polysilicon layer is deposited, doped and patterned to create a polysilicon gate structure. A lightly doped source and drain region is formed, defined by the polysilicon gate structure. A silicon oxide, first spacer is formed on the sides of the polysilicon gate structure, followed by the creation of a medium doped source and drain region, defined by the first insulator-polysilicon gate structure. A silicon nitride, second spacer is formed on the sides of the silicon oxide, first spacer, resulting in a double insulator spacer, on the polysilicon gate structure, and used to define the heavily doped source and drain region. After a buffered hydrofluoric acid pre-clean, a metal deposition is performed, followed by an anneal cycle, used to convert exposed silicon areas, the top surface of the polysilicon gate structure, and the top surfaces of the source and drain regions, to metal silicide. Unreacted metal, overlying the double insulator spacer, is then selectively removed resulting in the polycide gate structure, comprised of metal silicide overlying a polysilicon gate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
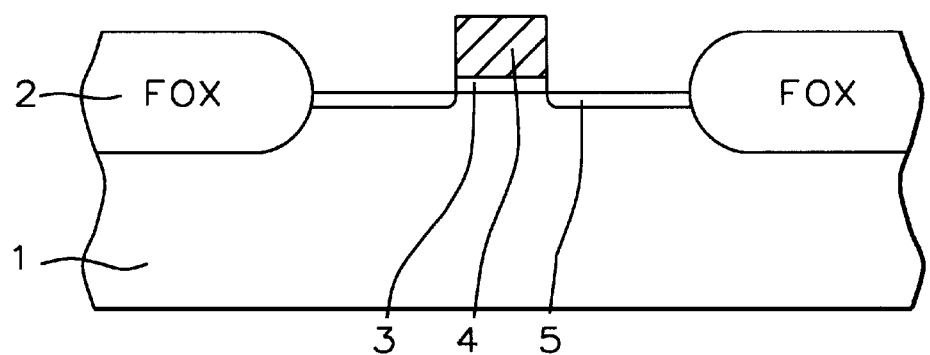
FIGS. 1–5, which schematically, in cross sectional style, illustrate the key fabrication stages used to create a MOSFET device, using a double insulator spacer, with improve source and drain engineering.

The method of forming a MOSFET device with a double insulator spacer, and with improved source and drain engineering, will now be described in detail. A P type, substrate, 1, consisting of single crystalline silicon, with a <100> crystallographic orientation, is used. Thick field oxide, (FOX), regions, 2, are formed for isolation purposes. The FOX regions, shown schematically in FIG. 1, are formed via thermal oxidation, in an oxygen-steam ambient, at a temperature between about 850 to 1050° C., to a thickness between about 4000 to 6000 Angstroms. Oxidation is prevented in non-isolation, device regions, via use of a patterned, composite oxidation resistant mask, consisting of an overlying silicon nitride layer and an underlying pad oxide layer. After the creation of FOX regions, 2, the composite mask is removed using a hot phosphoric acid solution for the silicon nitride layer, and a buffered hydrofluoric acid solution for the pad oxide layer. A layer of silicon dioxide, 3, used as the gate insulator layer, is then thermally grown, in an oxygen-steam ambient, at a temperature between about 850 to 1000° C., to a thickness between about 50 to 200 Angstroms. A polysilicon layer is next deposited via low pressure chemical vapor deposition, (LPCVD), procedures, at a temperature between about 600 to 800° C., to a thickness between about 500 to 5000 Angstroms. The polysilicon layer can be grown intrinsically and doped via ion implantation of either phosphorous or arsenic, at an energy between about 25 to 75 KeV, at a dose between about 1E14 to 1E16 atoms/cm$^2$, or the polysilicon layer can be grown using insitu doping procedures, adding either phosphine or arsine to a silane ambient. Conventional photolithographic, and reactive ion etching, (RIE), procedures, using $Cl_2$ as an etchant, are used to create polysilicon gate structure, 4, shown schematically in FIG. 1, with polysilicon gate structure having a width between about 0.05 to 2.0 uM. Photoresist removal is performed using plasma oxygen ashing, and careful wet cleans. A lightly doped source and drain region, 5, is next formed in semiconductor substrate, 1, via ion implantation of phosphorous or arsenic, at an energy between about 5 to 100 KeV, at a dose between about 1E11 to 1E14 atoms/cm$^2$. This is also illustrated schematically in FIG. 1.

Figure 2:
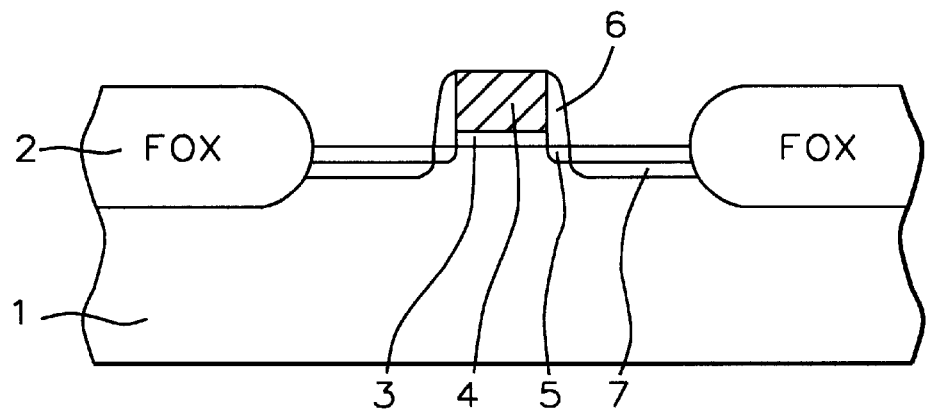

A first insulator spacer, 6, shown schematically in FIG. 2, is next created. First insulator spacer, 6, is formed by initially depositing a first insulator layer of silicon oxide, via either LPCVD, or plasma enhanced chemical vapor deposition, (PECVD), procedures, at a temperature between about 300 to 800° C., to a thickness between about 200 to 5000 Angstroms. The layer of silicon oxide used in the formation of first insulator spacer, 6, can also be obtained via thermal oxidation procedures, if desired. A selective, anisotropic RIE procedure, using $CHF_3$, or $CF_4$—$O_2$—He as an etchant is used to create first insulator spacer, 6, on the sides of polysilicon gate structure, 4. The selective RIE procedure is terminated when the laser endpoint detects silicon, exposed in the lightly doped source and drain region, 5, as well as silicon exposed in the top surface of polysilicon gate structure, 4. The width of first insulator spacer, 6, is approximately equal to the thickness of the deposited silicon oxide layer, between about 200 to 5000 Angstroms. Therefore if a heavily doped source and drain region were to be next processed, using only first insulator spacer, 6, as the spacer, too much lateral diffusion may occur, compensating more of the lightly doped source and drain region then desired, adversely influencing injection of not electron carriers, and thus introducing reliability concerns. In addition if only first insulator spacer, 6, is used for subsequent salicide processing, the pre-metal clean, in a buffered hydrofluoric acid solution, may thin first insulator spacer, 6, to point in which gate to substrate shorts or leakage, can occur due to metal silicide bridging. Therefore this invention addresses both compensation of the lightly doped source and drain regions and metal bridging, via the next series of process sequences.

After formation of first insulator spacer, 6, a medium doped'source and drain region, 7, is created, and shown schematically in FIG. 2. This is accomplished via ion implantation of arsenic or phosphorous, at an energy between about 5 to 50 KeV, at a dose between about 1E12 to 5E14 atoms/cm$^2$. This medium doped source and drain region will not be as heavily doped as a subsequent source and drain region, needed for contact purposes. Therefore less lateral diffusion will occur, resulting in less lightly doped source and drain region compensation, and thus reducing the risk of hot electron carrier injection that existed with the heavily doped source and drain procedure. In addition the medium source and drain region, 7, reduces the resistance of the lightly doped source and drain region, 5, underlying first insulator spacer, 6, thus improving performance.

Figure 3:
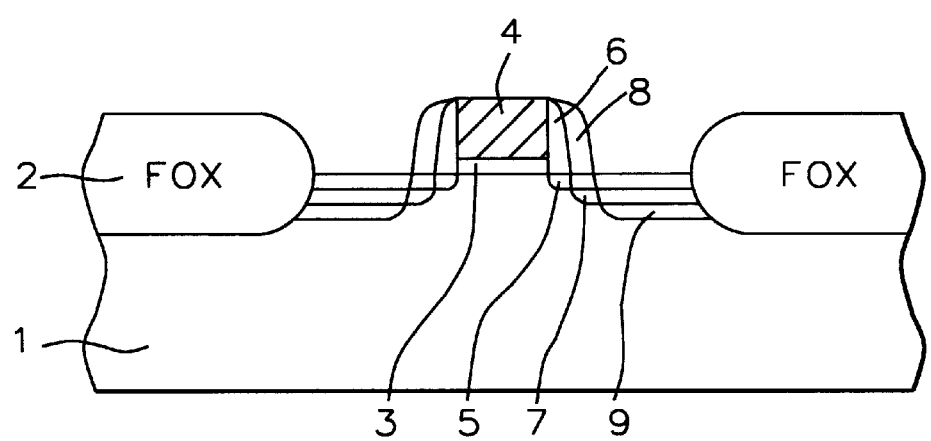

FIG. 3, shows the creation of a second insulator spacer, 8. A second insulator layer of silicon nitride is deposited via LPCVD or PECVD procedures, at a temperature between about 200 to 800° C., to a thickness between about 200 to 5000 Angstroms. Selective, anisotropic RIE procedures, using $CHF_3$ or $SF_6$ $O_2$ as an etchant are then employed to form second insulator spacer, 8. Laser endpoint detection again allows the RIE procedure to terminate at the appearance of silicon. Also shown in FIG. 3, is the creation of the heavily doped source and drain region, 9, needed for low resistance contacts. This is achieved via ion implantation of arsenic, at an energy between about 5 to 150 KeV, at a dose between about 1E15 to 1E16 atoms/cm$^2$. An anneal cycle is performed, using rapid thermal anneal, (RTA), procedures, at a temperature between about 800 to 1100° C., for between about 5 to 120 sec., to activate the dopants in the source and drain regions.

Figure 4:
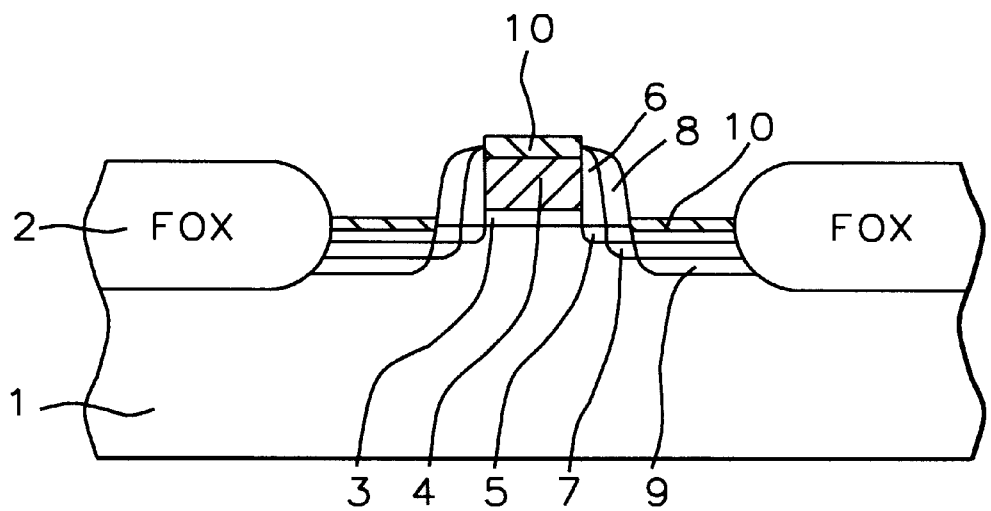

The Self-ALigned silICIDE, (salicide), process is next addressed. First a metal pre-clean of the surfaces, needed to remove native oxide from exposed silicon areas, is performed. This is accomplished via a buffered hydrofluoric acid treatment, for a time between about 5 to 120 sec. If the second insulator spacer, 8, of silicon nitride, were not used, the first insulator spacer, 6, of silicon oxide, may not have withstood the metal pre-clean procedure. The thin, first insulator spacer, 6, may have become defective due to thinning, and thus would not prevent metal silicide formation on the sides of the polysilicon gate structure, 4, resulting in possible gate to substrate shorts or leakage. After the metal pre-clean procedure, a layer of titanium is deposited, via r.f. sputtering procedures, to a thickness between about 50 to 1000 Angstroms. A rapid thermal anneal, (RTA), Procedure, at a temperature between about 550 to 700° C., for a time between about 20 to 90 sec., is used to form titanium silicide layer, 10, on heavily doped source and drain regions, 9, and the top surface of polysilicon gate structure, 4. Unreacted titanium, residing on the surface of second insulator spacer, 8, as well as on the surface of FOX region, 2, is selectively removed using a solution of $H_2O_2$—$H_2SO_4$. Therefore self-aligned, titanium silicide layers are created. The polycide gate structure of titanium silicide layer, 10, overlying polysilicon gate structure, 4, is schematically shown in FIG. 4.

Figure 5:
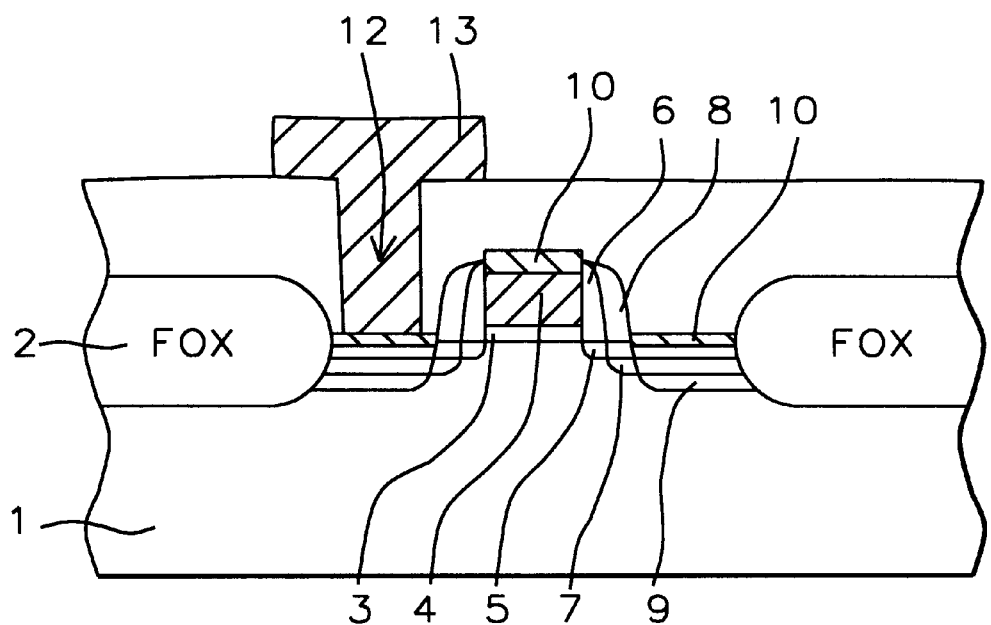

FIG. 5, shows the formation of metal contacts to metal silicided, heavily doped source and drain region, 9. Metal contact formation is also made to the polycide structure, although not shown in FIG. 5. First a silicon oxide layer, 11, is deposited via PECVD procedures, at a temperature between about 350 to 450° C., to a thickness between about 3000 to 6000 Angstroms. Conventional photolithographic and RIE procedures, using $CHF_3$ as an etchant, are used to open contact hole, 12. Photoresist is removed via plasma oxygen ashing and careful wet cleans. A layer of aluminum, containing between about 1 to 3% copper, and between about 0.5 to 1% silicon, is deposited via r.f. sputtering procedures, to a thickness between about 4000 to 8000 Angstroms. Conventional photolithographic and RIE procedures, using $Cl_2$ as an etchant, are used to create metal contact structure, 13, schematically shown in FIG. 5. Photoresist is once again removed via plasma oxygen ashing and careful wet cleans.

This process for fabricating a MOSFET device using a double insulator spacer, and improved source and drain engineering, although shown for a N channel MOSFET device, can also be applied to P channel MOSFETs, to complimentary, (CMOS), devices, as well as applied to bipolar-CMOS, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A MOSFET device structure featuring a metal silicide-polysilicon, polycide gate structure and a composite silicon nitride-silicon oxide spacer, with the top of the composite spacer terminating at the center of a side of the metal silicide component of the polycide gate structure, comprising:

field oxide regions on the surface of a semiconductor substrate;

a device region between said field oxide regions;

said polycide gate structure, comprised of a first metal silicide layer on a narrow, polysilicon gate structure, between about 500 to 2000 Angstroms in width, overlying a gate insulator layer, on said semiconductor substrate, in the center of said device region;

a first insulator spacer, comprised of silicon oxide, on the sides of said polycide structure, with the bottom of said first insulator spacer directly overlying only the entire first portion of the surface of said semiconductor substrate, with said first portion of the surface of said semiconductor substrate comprised of a lightly doped source/drain region, incorporating arsenic or phosphorous ions at a dose between about 1E11 to 1E14 atoms/cm$^2$ with a width between about 200 to 5000 Angstroms, extending from the sides of said polysilicon gate structure, and with said lightly doped source/drain region terminating at a first depth in said semiconductor substrate, and with the top of said first insulator spacer terminating at the center of the side of said first metal silicide layer on said polysilicon gate structure;

a second insulator spacer, comprised of silicon nitride, located on the sides of said first insulator spacer, and with the bottom of said second insulator spacer directly overlying only the entire second portion of the surface of said semiconductor substrate, where said second portion of the surface of said semiconductor substrate is comprised with a medium doped source/drain region, with a width between about 200 to 5000 Angstroms, extending from the edge of said first portion, or said lightly doped source/drain region and with said medium doped source/drain region terminating at a second depth in said semiconductor substrate, with said second depth greater in depth than said first depth, and with the top of said second insulator spacer located at the same height as said first insulator spacer;

a third portion of the surface of said semiconductor substrate, located between the edge of said second insulator spacer, or located at the edge of said medium doped source/drain region, and a field oxide region, and comprised with a heavily doped source/drain region, and with said heavily doped source/drain region terminating at a third depth in said semiconductor substrate, with said third depth greater in depth than said second depth;

a second metal silicide layer on the top surface of said third portion of the surface of said semiconductor substrate; and a metal contact structure, overlying and contacting, a portion of said second metal silicide layer.

2. The MOSFET device structure of claim 1 wherein said first insulator spacer is comprised of silicon oxide, at a thickness between about 200 to 5000 Angstroms.

3. The MOSFET device structure of claim 1, wherein said second insulator spacer is comprised of silicon nitride, at a thickness between about 200 to 5000 Angstroms.

4. The MOSFET device structure of claim 1, wherein said medium doped source and drain region is comprised of arsenic or phosphorous, at a dose between about 1E12 to 5E14 atoms/c$^2$.

5. The MOSFET device structure of claim 1, wherein said heavily doped source and drain region is comprised of arsenic, at a dose between about 1E15 to 1E16 atoms/cm$^2$.

* * * * *